(12) United States Patent
Yeo et al.

(10) Patent No.: US 6,556,646 B1
(45) Date of Patent: Apr. 29, 2003

(54) SHIFT REGISTER

(75) Inventors: Ju Cheon Yeo, Dongan-ku (KR); Sang Young Yoon, Dongan-ku (KR)

(73) Assignee: LG. Philips LCD Co., Ltd., Seoul (KR)

(*) Notice: Subject to any disclaimer, the term of this patent is extended or adjusted under 35 U.S.C. 154(b) by 0 days.

(21) Appl. No.: 09/384,899

(22) Filed: Aug. 27, 1999

(30) Foreign Application Priority Data

Oct. 21, 1998 (KR) ............................................. 98-44180

(51) Int. Cl.[7] ............................................... G11C 19/00
(52) U.S. Cl. ............................... 377/54; 377/64; 377/75
(58) Field of Search ............................. 377/54, 71, 72, 377/75, 73, 74, 77, 78, 79, 81, 64

(56) References Cited

U.S. PATENT DOCUMENTS

| | | | | |
|---|---|---|---|---|
| 5,510,805 A | | 4/1996 | Lee ................. | 345/58 |
| 5,517,543 A | | 5/1996 | Schleupen et al. ........... | 377/79 |
| 5,648,790 A | | 7/1997 | Lee ................. | 345/58 |
| 5,650,741 A | * | 7/1997 | Nakamura et al. ........ | 327/327 |
| 6,064,713 A | * | 5/2000 | Lebrun et al. ............... | 377/67 |

FOREIGN PATENT DOCUMENTS

| EP | 0 801 376 A2 | 10/1997 |
|---|---|---|
| EP | 0 957 491 A1 | 11/1999 |

* cited by examiner

*Primary Examiner*—Tuan T. Lam
(74) *Attorney, Agent, or Firm*—McKenna Long & Aldridge LLP

(57) ABSTRACT

A shift register for driving a pixel row in a liquid crystal display device. In the shift register, a plurality of stages are connected to a high level voltage source, a low level voltage source and a phase-delayed clock signal generator, connected to row lines, and connected, in cascade, with respect to a scanning signal, for charging and discharging the row lines. In each stage of the shift register, an output circuit is provided with a pull-up transistor having a first input electrode for receiving a first clock signal having a delayed phase in comparison to the scanning signal, a first output electrode connected to the raw line and a first control electrode, and a pull-down transistor having a second input electrode connected to the low level voltage source, a second output electrode connected to the row line and a second control electrode. An input circuit responds to the scanning signal to generate a first control signal to be applied to the first control electrode, and responds to a second clock signal having a delayed phase in comparison to the first clock signal to generate a second control signal to be applied to the second control electrode.

30 Claims, 11 Drawing Sheets

SHIFT REGISTER

This application claims the benefit of Korean Patent Application No. P98-44180, filed on Oct. 21, 1998.

BACKGROUND OF THE INVENTION

1. Field of the Invention

This invention relates to a circuit for driving a display device of active matrix type, and more particularly to a shift register for driving pixel rows in a liquid crystal display.

2. Description of the Prior Art

Figure 1:
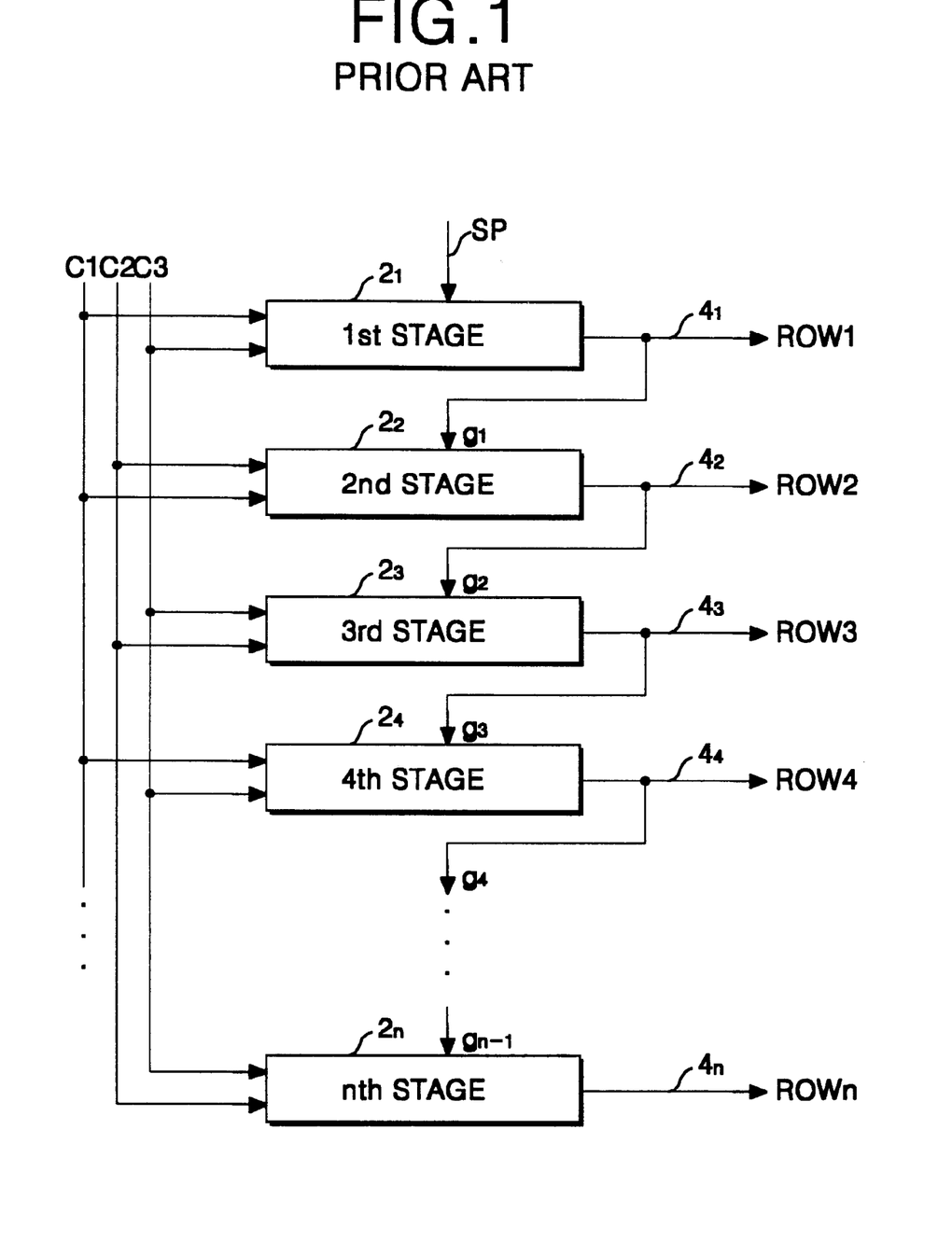
FIG. 1 is a schematic block diagram showing the configuration of a conventional shift register.

Generally, a conventional liquid crystal display device used in a television or a computer includes a liquid crystal matrix having liquid crystal cells arranged at intersections of data lines and select or gate lines. The select lines are horizontal lines (i.e., row lines) of the liquid crystal matrix, which are sequentially driven with a shift register. As shown in FIG. 1, the conventional shift register includes n stages $2_1$ to $2_n$ connected in cascade and simultaneously connected, via output lines to $4_1$ to $4_n$, to n row lines ROW1 to ROWn or gate lines, respectively. A scanning pulse SP is inputted to the first stage $2_1$, and output signals $g_1$ to $g_{n-1}$ of the previous stages are inputted to the 2nd to nth stages $2_2$ to $2_n$, respectively. Also, n stages $2_1$ to $2_n$ receive two clock signals out of three clock signals C1 to C3. Each of the n stages $2_1$ to $2_n$ drives an associated row line ROWi connected to a pixel train with the two clock signals and the output signals of previous stages or with the two clock signals and the scanning pulse SP.

Figure 2:
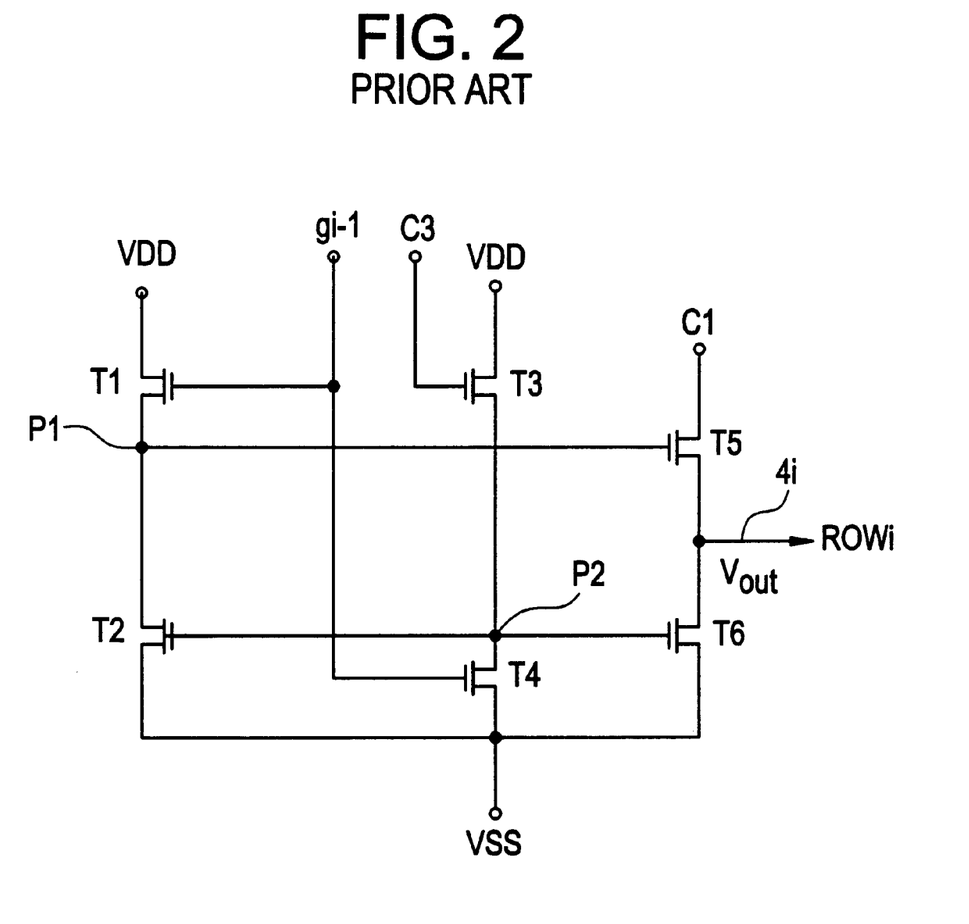
FIG. 2 is a detailed circuit diagram of each stage in FIG. 1.
Figure 3:
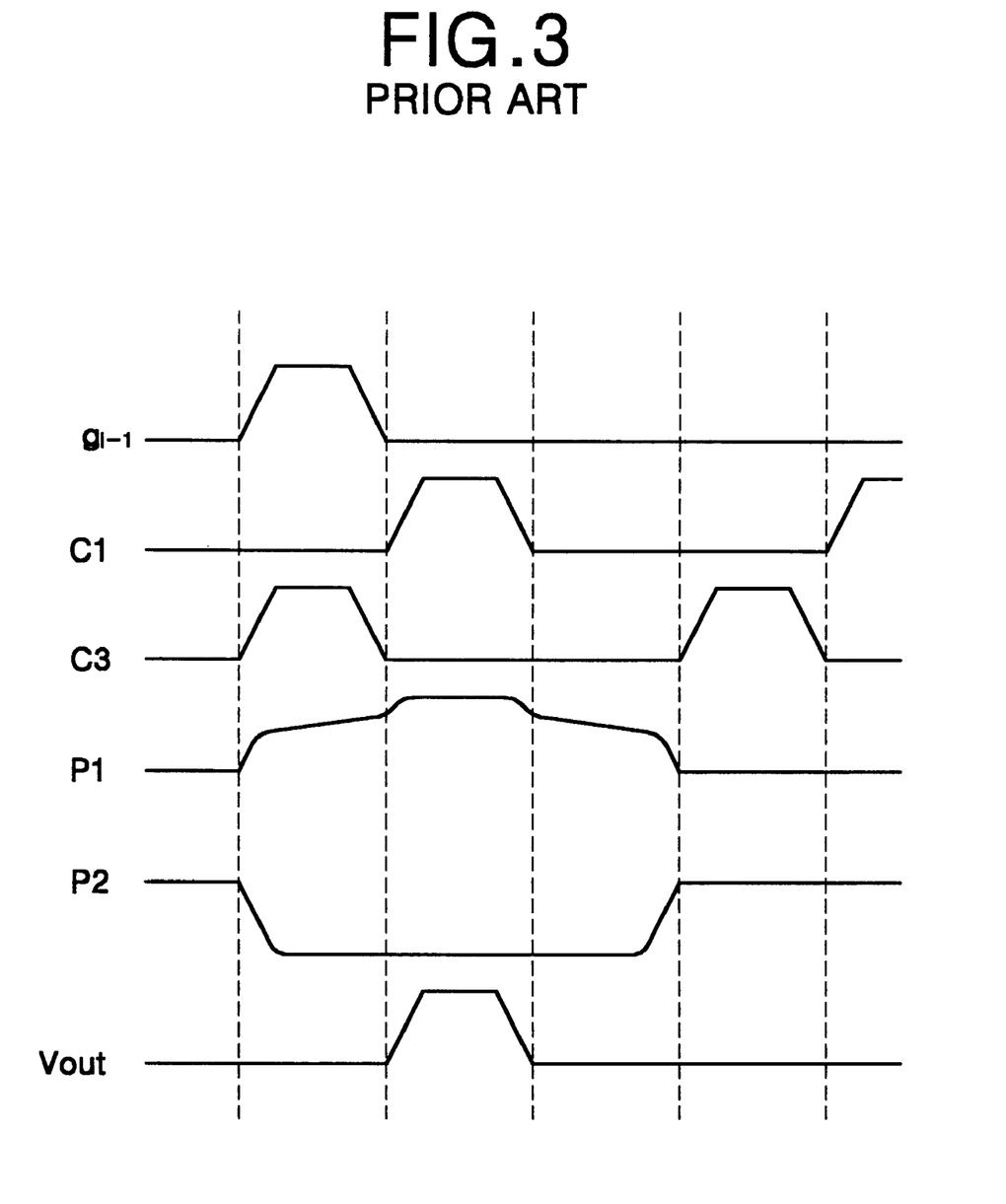
FIG. 3 is input/output waveform diagrams of the stage in FIG. 2.

As shown in FIG. 2, each of the stages $2_1$ to $2_n$ includes a fifth NMOS transistor T5 for applying a high logic voltage signal to an output line $4_i$, and a sixth NMOS transistor T6 for applying a low logic voltage signal to the output line $4_i$. If a high logic level of (i−1)th row line input signal $g_{i-1}$ is applied from the previous stage $2_{i-1}$, then first and fourth NMOS transistors T1 and T4 are turned on. As seen from FIG. 3, a high logic level of third clock signal C3 is synchronized with the (i−1)th row line input signal $g_{i-1}$ and applied to a third NMOS transistor T3 , thereby turning on the third NMOS transistor T3 . The third and fourth NMOS transistors T3 and T4 are a so-called 'ratioed logic' which are set to an appropriate ratio of resistance values in such a manner that a voltage at a second node P2 becomes a low level when the third and fourth NMOS transistors T3 and T4 are simultaneously turned on. Accordingly, when (i−1)th row line input signal $g_{i-1}$ is applied, a low logic level voltage emerges at the second node P2. At this time, the second and sixth NMOS transistor T2 and T6 are turned off by a low logic level voltage from the second node P2. A first node P1 is charged into a high logic level voltage by a supply voltage VDD when the first NMOS transistor T1 is turned on and the second NMOS transistor T2 is turned off. When the high logic level voltage at the first node P1 arrives at a threshold voltage thereof, the fifth NMOS transistor T5 is turned off. At this time, since the first clock signal C1 remains at a low logic level, a low logic level voltage emerges at the output line $4_i$.

Figure 4:
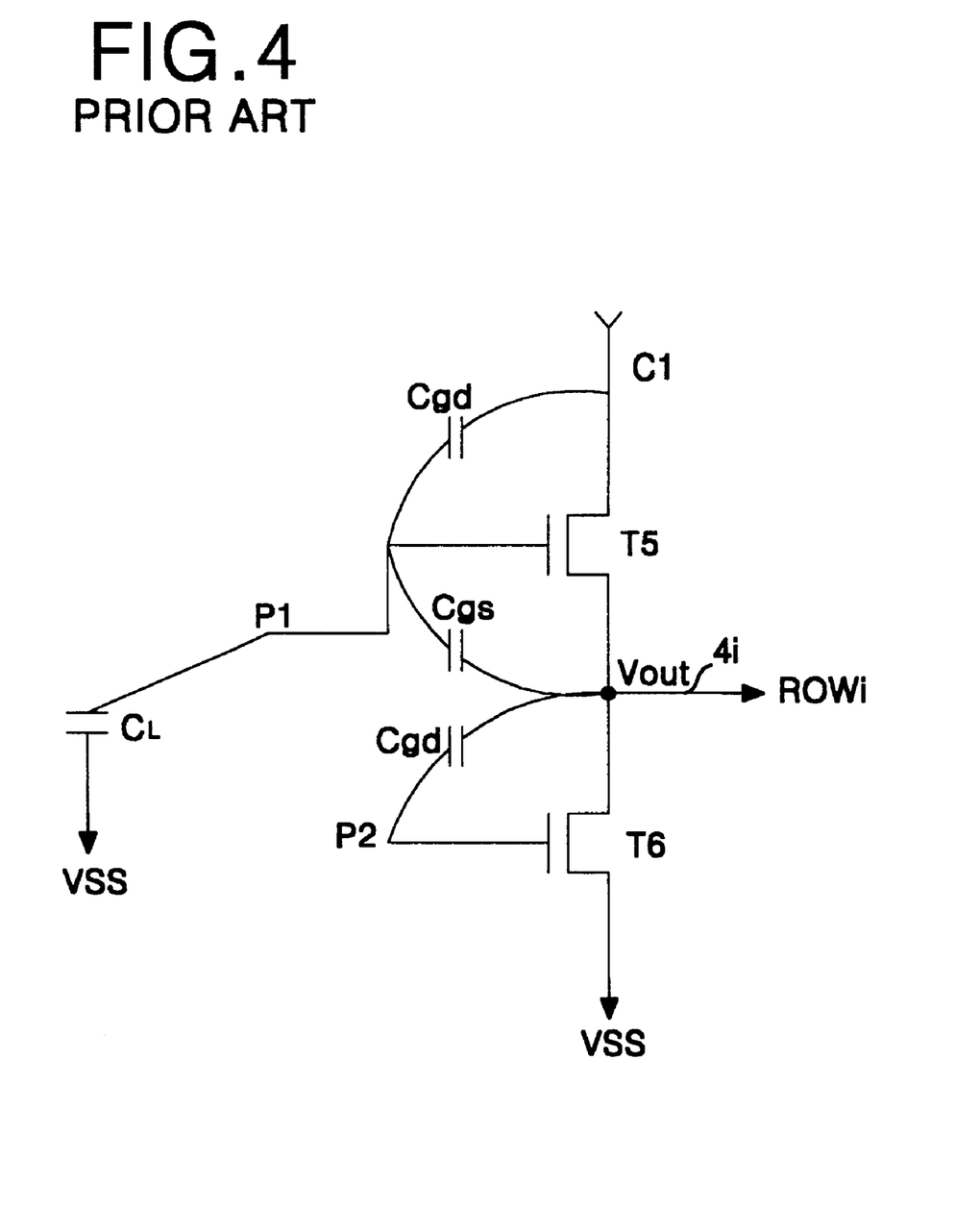
FIG. 4 is a detailed circuit diagram of the output part of the stage in FIG. 2.

If the first clock signal C1 has a high logic level voltage during a time interval when a voltage at the first node P1 remains at a high logic level, then the output line $4_i$ becomes a high logic level by a high logic level first clock signal C1 applied via the fifth NMOS transistor T5. Accordingly, a high logic level output signal Vout emerges at the output line $4_i$. At this time, since the output line $4i$ and the first node P1 are coupled as shown in FIG. 4 with a parasitic capacitance Cgs existing between the gate and the source of the fifth NMOS transistor T5, a voltage at the first node P1 is bootstrapped into a high logic voltage level. Accordingly, the high logic level voltage of the first clock signal C1 is applied to the output line $4i$ almost without a loss. Such a bootstrap system is used to compensate a voltage loss caused by a threshold voltage generated at a circuit including NMOS transistors.

Also, if the first clock signal C1 is changed from a high logic level voltage into a low logic level voltage, a voltage Vout at the output line $4_i$ drops into a low logic level voltage because the fifth NMOS transistor T5 is in a turned-off state. Furthermore, since the first and fourth NMOS transistors T1 and T4 are turned off by the (i−1)th row line input signal gin having a low logic level voltage in such a manner to be supplied with no voltage, a voltage level at the first node P1 also drops slowly. In such a state, if the third clock signal C3 has a high logic level voltage, then the third NMOS transistor T3 is turned off to thereby begin charging the second node P2 into a high logic level voltage with the aid of the supply voltage VDD applied via the third NMOS transistor T3. The sixth NMOS transistor T6 is turned on by a voltage signal higher than its threshold voltage applied from the second node P2 to discharge a voltage charged on the output line $4_i$ toward a ground voltage VSS. As a result, a voltage at the row line ROWi connected to the output line $4_i$ maintains a low logic level.

In order to operate such a shift register normally, a resistance ratio of the third and fourth NMOS transistors T3 and T4 serving as a ratioed logic must be set accurately. In other words, in order to generate a low logic level voltage at the second node P2 when the third clock signal C3 having a high level voltage and the (i−1)th row line input signal $g_{i-1}$ are applied simultaneously to the gates of the third and fourth NMOS transistors T3 and T4, a channel width of the fourth NMOS transistor T4 must be about ten times larger than that of the third NMOS transistor T3. If characteristics of the NMOS transistors T3 and T4 become non-uniform, a current ratio of the third NMOS transistor T3 to the fourth NMOS transistor T4 varies. In this case, the shift register fails to operate properly.

Further, since a direct current flows continuously at the third and fourth NMOS transistors T3 and T4 when the third and fourth NMOS transistors T3 and T4 are simultaneously turned on by the third clock signal C3 and the (i−1)th row line input signal $g_{i-1}$, the characteristics of the third and fourth NMOS transistors T3 and T4 are susceptible to deterioration by overcurrent. Also, if the first clock signal C1 is changed from a low logic level voltage into a high logic level voltage during an interval when a voltage at the first node P1 is in a state of high logic level, then a rising width in a bootstrapped voltage at the first node P1 becomes different in accordance with a parasitic capacitance value of the fifth NMOS transistor T5 and a change in the parasitic capacitance at the first node P1. The voltage rising width at the first node P1 is as described in the following formula (1):

$$\Delta Vp1 = \frac{CAP + C_{OX}}{C_{LI} + CAP + C_{OX}} \Delta Vout \qquad (1)$$

wherein $\Delta Vp1$ and $\Delta Vout$ represent a voltage change amount at the first node P1 and a voltage change amount at the output line $4_i$, respectively, and $C_L$ and $C_{ox}$ represents a parasitic capacitance at the first node P1 and a parasitic capacitance of the fifth NMOS transistor T5, respectively. The parasitic capacitance $C_{ox}$ of the fifth NMOS transistor T5 is equal to a sum of parasitic capacitance Cgs between the gate and the source thereof and parasitic capacitance Cds between the drain and the gate thereof.

As seen from the formula (1), since a rising width in a voltage at the first node P1 is changed by the capacitance $C_L$ at the first node P1 and the parasitic capacitance $C_{ox}$ of the fifth NMOS transistor T5, it is difficult to set a characteristic of shift register accurately. Moreover, in the shift register of FIG. 2, the output voltage Vout at the output line $4_i$ is distorted because a voltage at the second node P2 also is raised by a parasitic capacitance between the gate and the drain of the sixth NMOS transistor T6 as a voltage at the output line $4_i$ changes into a high logic level.

SUMMARY OF THE INVENTION

Accordingly, it is an object of the present invention to provide a shift register that is adaptive for preventing a change in a circuit characteristic caused by a change in a parasitic capacitance.

A further object of the present invention is to provide a shift register that is adaptive for preventing a deterioration in a circuit characteristic caused by overcurrent.

A still further object of the present invention is to provide a shift register that is adaptive for minimizing a voltage loss caused by the threshold voltage.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

In order to achieve these and other objects of the invention, a shift register according to one aspect of the present invention includes a plurality of stages which are commonly connected to a high level voltage source, a low level voltage source and a phase-delayed clock signal generator, connected to row lines, and connected, in cascade, with respect to a scanning signal, for charging and discharging the row lines.

Each of the plurality of stages included in the shift register according to one aspect of the present invention comprises output circuit means including a pull-up transistor and a pull-down transistor, said pull-up transistor having a first input electrode for receiving a first clock signal having a delayed phase in comparison to the scanning signal, a first output electrode connected to the row line, and a first control electrode; said pull-down transistor having a second input electrode connected to the low level voltage source, a second output electrode connected to the row line, and a second control electrode; input circuit means being responsive to the scanning signal for generating a first control signal to be applied to the first control electrode, and responsive to a second clock signal having a delayed phase in comparison to the first clock signal for generating a second control signal to be applied to the second control electrode; and means for raising a voltage of the first control signal.

Each of the plurality of stages included in the shift register according to another aspect of the present invention comprises output circuit means including a pull-up transistor and a pull-down transistor, said pull-up transistor having a first input electrode for receiving a first clock signal having a delayed phase in comparison to the scanning signal, a first output electrode connected to the row line, and a first control electrode; said pull-down transistor having a second input electrode connected to the low level voltage source, a second output electrode connected to the row line, and a second control electrode; input circuit means being responsive to the scanning signal for generating a first control signal to be applied to the first control electrode, and responsive to a second clock signal having a delayed phase in comparison to the first clock signal for generating a second control signal to be applied to the second control electrode; means for raising a voltage of the first control signal; and means for discharging the second control signal during a time interval when the first control signal is enabled.

Each of the plurality of stages included in the shift register according to still another aspect of the present invention comprises output circuit means including a pull-up transistor and a pull-down transistor, said pull-up transistor having a first input electrode for receiving a first clock signal having a delayed phase in comparison to the scanning signal, a first output electrode connected to the row line, and a first control electrode; said pull-down transistor having a second input electrode connected to the low level voltage source, a second output electrode connected to the row line, and a second control electrode; input circuit means being responsive to the scanning signal for generating a first control signal to be applied to the first control electrode, and responsive to a second clock signal having a delayed phase in comparison to the first clock signal for generating a second control signal to be applied to the second control electrode; means for raising a voltage of the first control signal; and means for accelerating a discharging speed at the row line.

It is to be understood that both the foregoing general description and the following detailed description are exemplary and explanatory and are intended to provide further explanation of the invention as claimed.

BRIEF DESCRIPTION OF THE DRAWINGS

These and other objects of the invention will be apparent from the following detailed description of the embodiments of the present invention with reference to the accompanying drawings, in which.

DETAILED DESCRIPTION OF THE PREFERRED EMBODIMENTS

Figure 5:
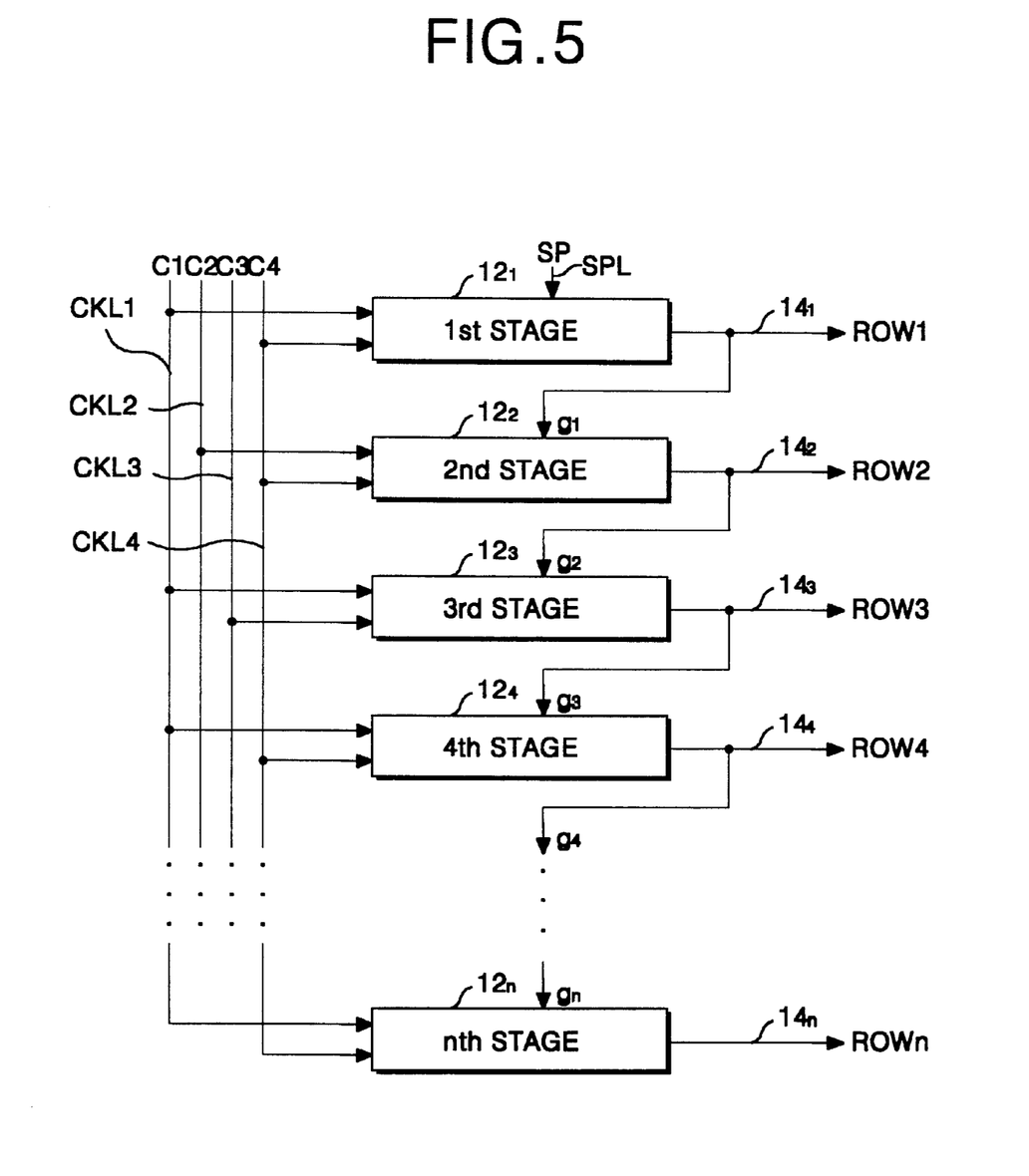
FIG. 5 is a schematic block diagram showing the configuration of a shift register according to an embodiment of the present invention.

Referring to FIG. 5, there is shown a shift register according to a first embodiment of the present invention.

The shift register includes n stages $12_1$ to $12_n$ connected, in cascade, to a scanning pulse input line SPL to drive m x n pixel array. Output lines $14_1$ to $14_n$ of the n stages $12_1$ to $12_n$ are connected to n row lines ROW1 to ROWn included in the pixel array, respectively. A scanning pulse SP is inputted to the first stage $12_1$, and output signals $g_1$ to $g_{n-1}$ of the 1st to (n−1)th stages $12_1$ to $12_{n-1}$ are applied as a scanning pulse to the subsequent stages $12_2$ to $12_n$, respectively.

Figure 6:
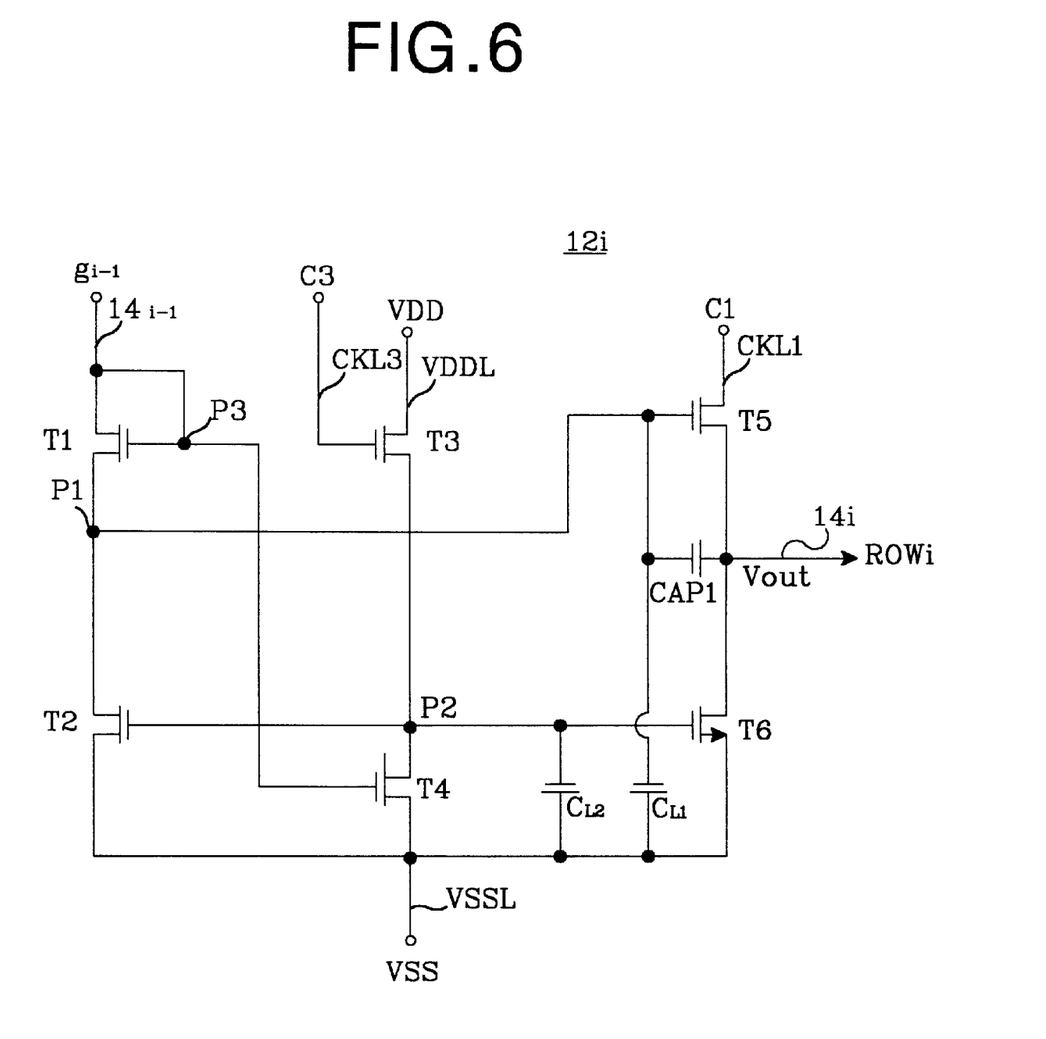
FIG. 6 is a detailed circuit diagram of an embodiment of the shift register stage in FIG. 5.

The shift register receives first to fourth clock signals C1 to C4, which are phase-delayed in comparison to the scanning pulse, a supply voltage VDD and a ground voltage VSS from the exterior driving system in addition to the scanning pulse. As shown in FIG. 6, each of the stages $12_1$ to $12_n$ includes a first NMOS transistor T1 connected among a scanning pulse input line $14_{i-1}$, a first node P1 and a third node P3; a second NMOS transistor T2 connected among the first node P1, a second node P2 and a ground voltage line VSSL; a third NMOS transistor T3 connected between a third clock signal line CLK3 and the second node P2; a fourth NMOS transistor T4 connected among the second node P2, the third node P3 and the ground voltage line VSSL; a capacitor CAP1 connected between the first node P1 and an output line $14_i$; a fifth NMOS transistor T5 connected between the first clock signal line CLK1 and the output line $14_i$; and a sixth NMOS transistor T6 connected among the second node P2, the output line $14_i$ and the ground voltage line VSSL.

If a high logic level of (i−1)th row line input signal $g_{i-1}$, is applied from the previous stage $12_{i-1}$ to the scanning pulse input line $14_{i-1}$, then first and fourth NMOS transistors T1 and T4 are turned on. Accordingly, a voltage at the first node P1 is changed into a high logic level by the supply voltage VDD applied as the first NMOS transistor T1 is turned on, and a voltage at the second node P2 is discharged toward a ground voltage source VSS as the fourth NMOS transistor T4 is turned on. As a result a low logic level voltage emerges at the second node P2.

Figure 7:
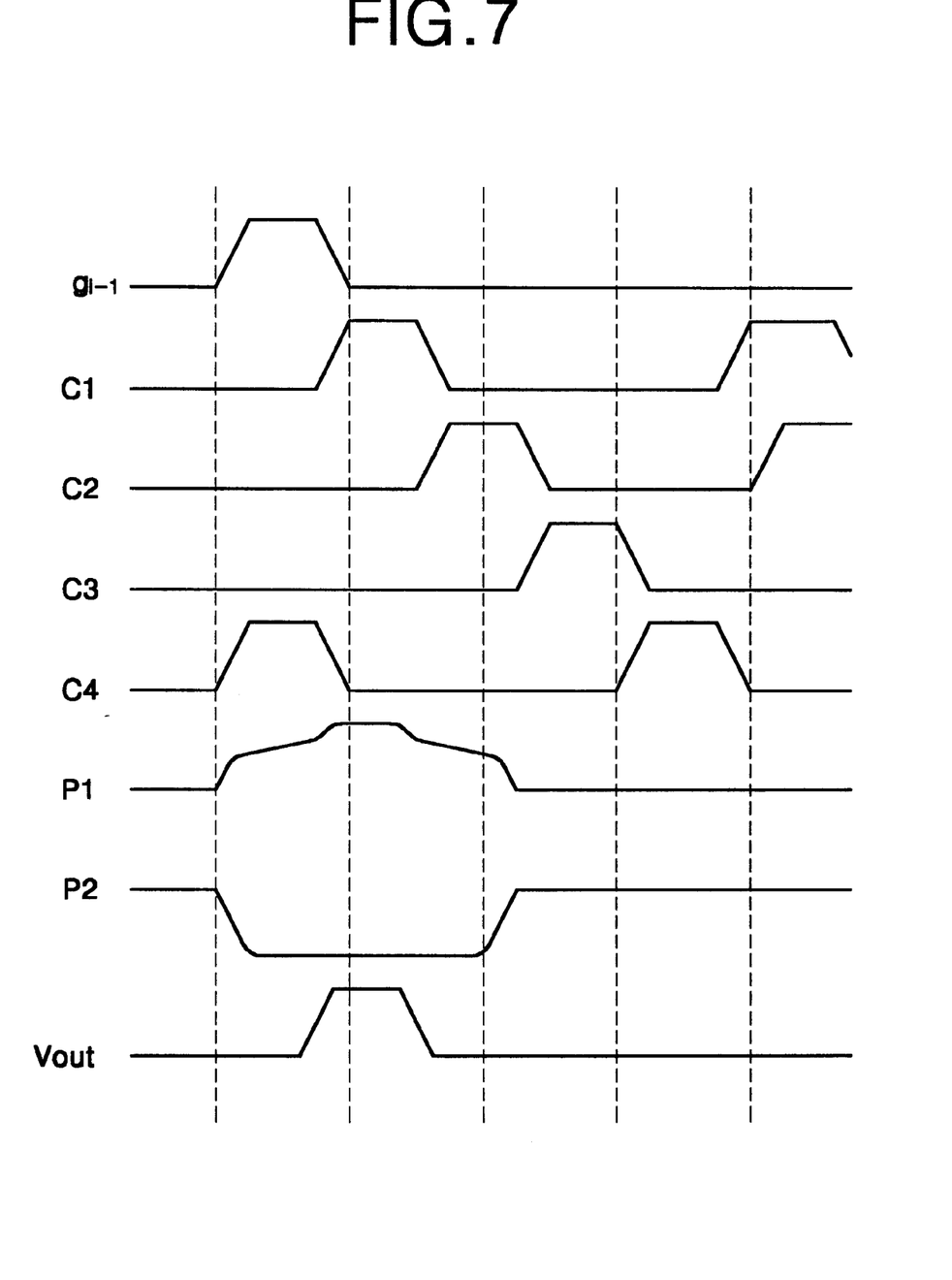
FIG. 7 is input/output waveform diagrams of the stage in FIG. 6.

As seen from FIG. 7, the third clock signal C3 remains at a low level voltage during a time interval when the (i−1)th row line input signal $g_{i-1}$ has a high logic level voltage. In other words, a high logic level voltage region of the third clock signal C3 is not overlapped with a high level voltage region of the (i−1)th row line input signal $g_{i-1}$. Accordingly, the third and fourth NMOS transistors T3 and T4 are not turned on simultaneously, so that a voltage at the second node P2 is determined independently of a channel width ratio (i.e., resistance ratio) of the third NMOS transistor T3 to the fourth NMOS transistor T4. Accordingly, even when device characteristics of the third and fourth NMOS transistors T3 and T4 are not uniform, a circuit characteristic of the shift register is not changed to such a large extent to make its normal operation impossible. Also, the third and fourth NMOS transistors T3 and T4 are not simultaneously turned on, so that overcurrent does not flow at the third and fourth NMOS transistors T3 and T4. As a result, device characteristics of the third and fourth transistors T3 and T4 are not deteriorated and, furthermore, the power consumption is reduced.

If a high logic level voltage appears at the first node P1, then the fifth NMOS transistor T5 is turned on. In this state, when the first clock signal C1 has a high logic level voltage, the output line $14_i$ begins to reach a high logic level of first clock signal C1 via the drain and the source of the fifth NMOS transistor T5. Accordingly, a high logic level of output signal Vout emerges at the output line $14_i$. The capacitor CAP1 raises a voltage at the first node P1 by the voltage level of the first clock signal C1 when a high level of first clock signal C1 is applied to the output line $14_i$. Since a gate voltage is increased by means of the capacitor CAP1, the fifth NMOS transistor T5 rapidly transfers the high logic level of the first clock signal C1 to the output line 14i without any attenuation and with shorter delay. Accordingly, a voltage loss caused by a threshold voltage of the fifth NMOS transistor T5 is minimized. In this embodiment, the capacitor CAP1 can be replaced by a parasitic capacitance existing in the fifth NMOS transistor T5.

If the first clock signal C1 changes from a high logic level voltage into a low logic level voltage, then the output signal Vout at the output line $14_i$ also changes from a high level voltage into a low level voltage. This results from the fifth NMOS transistor T5 being in a turned-on state with the aid of a voltage at the first node P1.

Next, if the third clock signal C3 changes from a low logic level voltage into a high logic level voltage, then the third NMOS transistor T3 is turned on in such a manner that a voltage at the second node P2 has a high level. The second NMOS transistor T2 is also turned on with the aid of a high logic level voltage at the second node P2 applied to its gate to thereby discharge a voltage at the first node P1 toward the ground voltage source VSS connected to the ground voltage line VSSL. In a similar manner, the sixth NMOS transistor T6 also discharges a voltage at the output line $14_i$, via the ground voltage line VSSL, into the ground voltage source VSS with the aid of a high level voltage at the second node P2 applied to its gate. As a result, both a voltage at the first node P1 and an output signal Vout at the output line $14_i$ have a low logic level voltage.

On the other hand, when the first clock signal C1 inputted to the drain of the fifth NMOS transistor T5 is such a state that a voltage at the first node P1 remains at a high logic level changes from a high logic level voltage into a low logic level voltage, a voltage at the first node P1 rises. At this time, a voltage rising width ΔVp at the first node P1 can be established accurately by the capacitor CAP1 connected between the first node P1 and the output line $14_i$ and a capacitor $C_{L1}$ provided between the first node P1 and the ground voltage line VSSL. The voltage rising width ΔVp at the first node P1 is as described in the following formula (2):

$$\Delta Vp1 = \frac{CAP + C_{OX}}{C_{L1} + CAP + C_{OX}} \Delta Vout \qquad (2)$$

wherein $C_{ox}$ represents a parasitic capacitance of the fifth NMOS transistor T5. Preferably, capacitances of the capacitors CAP1 and $C_{L1}$ are preferably set to about 0.1 to 10 pF. However, other suitable values may be used.

Figure 8:
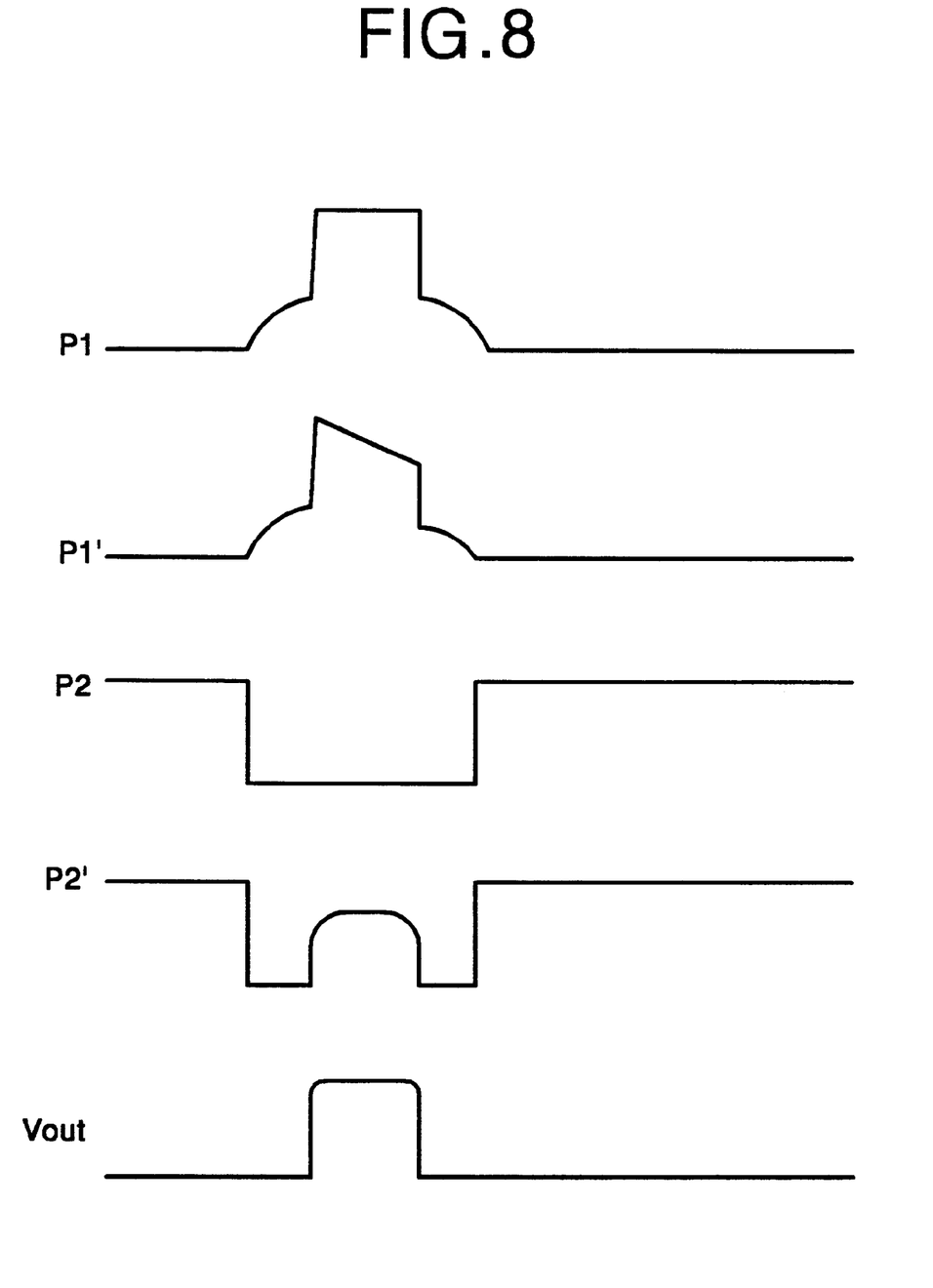
FIG. 8 is voltage waveform diagrams showing a variation in voltages at first and second nodes resulting from the presence of the capacitance $C_{L2}$ in FIG. 6.

The shift register further includes a capacitor $C_{L2}$ connected between the second node P2 and the ground voltage line VSSL. The capacitor $C_{L2}$ restrains a voltage variation at the second node P2 when the output signal Vout at the output line $14_i$ changes and a voltage variation at the second node P2 due to leakage current. Such a restraint of the voltage variation can be seen from voltage waveforms P1 and P2 at the first and second nodes when the capacitor $C_{L2}$ is provided and voltage waveforms P1' and P2' at the first and second nodes when the capacitor $C_{L2}$ is not provided, as shown in FIG. 8.

Figure 9:
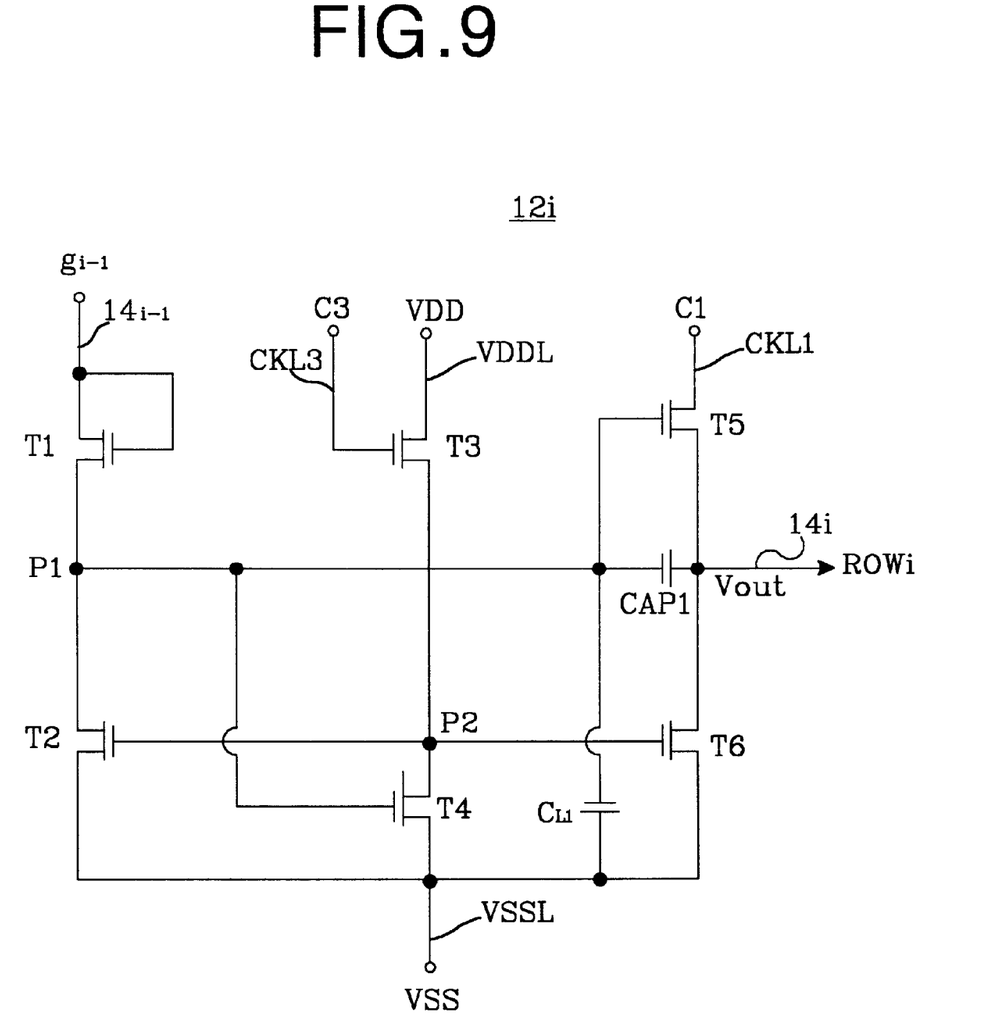
FIG. 9 is a detailed circuit diagram of another embodiment of the stage in FIG. 5.

Referring now to FIG. 9, there is shown each stage of a shift register according to another embodiment of the present invention. The shift register will be described with reference to the waveform diagrams in FIG. 7. In FIG. 9, the ith stages $12_i$ includes a first NMOS transistor T1 connected between a scanning pulse input line $14_i$ and a first node P1;

a second NMOS transistor T2 connected among the first node P1, a second node P2 and a ground voltage line VSSL; a third NMOS transistor T3 connected among a supply voltage line VDDL, a third clock signal line CLK3 and the second node P2; a fourth NMOS transistor T4 connected among the first node P1, the second node P2 and the ground voltage line VSSL; a capacitor CAP1 connected between the first node P1 and an output line $14_i$; a fifth NMOS transistor T5 connected between the first clock signal line CLK1 and the output line $14_i$ ; and a sixth NMOS transistor T6 connected among the second node P2, the output line $14_i$ and the ground voltage line VSSL.

If a high logic level of (i−1)th row line input signal $g_{i-1}$ is applied from the previous stage $12_{i-1}$ to the scanning pulse input line $14_i$, then first NMOS transistors T1 is turned on to charge a voltage at the first node P1 into a high logic level. When the voltage at the first node P1 is charged into a level higher than the threshold voltage, the fourth and fifth NMOS transistors T4 and T5 are turned on. As the fourth NMOS transistor T4 is turned on, a voltage at the second node P2 is discharged, via the fourth NMOS transistor T4 and the ground voltage line VSSL, toward the ground voltage source VSS. Accordingly, a voltage at the second node P2 is not varied during a time interval when a voltage at the first node P1 remains at a high logic level (i.e., when the (i−1)th row line input signal gi−1 remains at a high logic level). Further, since a voltage at the second node P2 becomes a low logic level, the second and sixth NMOS transistors T2 and T6 are turned off. As seen from FIG. 7, the third clock signal C3 remains at a low logic level voltage during a time interval when the (i−1)th row line input signal $g_{i-1}$ has a high logic level voltage, so that a voltage level at the second node P2 is determined independently of a channel width ratio (i.e., resistance ratio) of the third NMOS transistor to the fourth NMOS transistor T4. Subsequently, if the first clock signal C1 changes from a low logic level voltage into a high logic level voltage, then the output line $14_i$ is charged into a high logic level voltage with the aid of a high logic level of fist clock signal C1 is applied via the drain and the source of the fifth NMOS transistor T5. At this time, the capacitor CAP1 bootstraps a voltage at the first node P1 by a voltage of the first clock signal C1 when the high logic level of first clock signal C1 is applied to the output line $14_i$.

Further, if the first clock signal C1 transits from a high logic level voltage into a low logic level voltage, the output signal Vout at the output line $14_i$ drops into a low logic level. This results from the fifth NMOS transistor T5 being in a turned-on state.

Next, if the third clock signal C3 changes from a low logic level voltage into a high logic level voltage, then the third NMOS transistor T3 is turned on to charge the second node P2 into a high logic level voltage with the aid of a high level of third clock signal C3. The second NMOS transistor T2 also is turned on with the aid of a high logic level voltage at the second node P2 applied to its gate to thereby discharge a voltage at the first node P1 toward the ground voltage source VSS connected to the ground voltage line VSSL. In a similar manner, the sixth NMOS transistor T6 also discharges an output signal Vout at the output line $14_i$, via the ground voltage line VSSL, into the ground voltage source VSS with the aid of a high logic level voltage at the second node P2 applied to its gate. As a result, both a voltage at the first node P1 and an output signal Vout at the output line $14_i$ have a low logic level.

Figure 10:
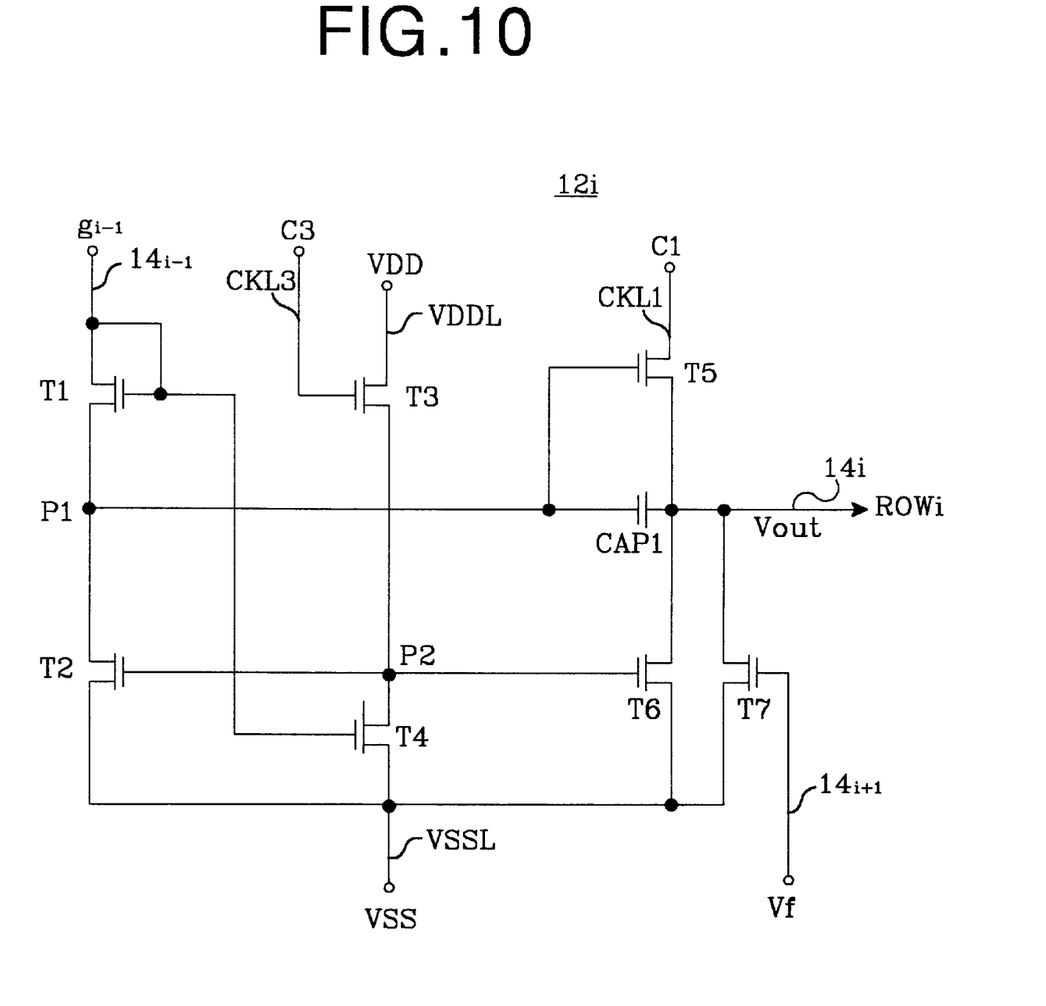
FIG. 10 is a detailed circuit diagram of still another embodiment of the stage in FIG. 5.

Referring to FIG. 10, there is shown each stage of a shift register according to still another embodiment of the present invention. The shift register of FIG. 10 will be described with reference to the waveform diagrams in FIG. 7. In FIG. 10, the ith stages $12_i$ includes a first NMOS transistor T1 connected between a scanning pulse input line $14_{i-1}$ and a first node P1; a second NMOS transistor T2 connected among the first node P1, a second node P2 and a ground voltage line VSSL; a third NMOS transistor T3 connected among a supply voltage line VDDL, a third clock signal line CLK3 and the second node P2; a fourth NMOS transistor T4 connected among the first NMOS transistor T1, the second node P2 and the ground voltage line VSSL; a capacitor CAP1 connected between the first node P1 and an output line $14_i$; a fifth NMOS transistor T5 connected between the first clock signal line CLK 1 and the output line $14_i$; a sixth NMOS transistor T6 connected among the second node P2, the output line $14_i$ and the ground voltage line VSSL; and a seventh NMOS transistor T7 connected between the output line $14_i$ and the ground voltage line VSSL.

If a high level of (i−1)th row line input signal gi-1 is applied from the previous stage $12_{i-1}$ to the scanning pulse input line $14_{i-1}$, then first NMOS transistors T1 is turned on to charge a voltage at the first node P1 into a high logic level. The fourth NMOS transistor T4 also is turned on with the aid of a high level of row line input signal gi$_1$, a voltage at the second node P2 is discharged, via the ground voltage line VSSL, toward the ground voltage source VSS. Accordingly, a voltage at the second node P2 is not varied by the fourth NMOS transistor T4 during a time interval when a voltage at the first node P1 remains at a high level. Such a voltage level at the second node P2 is determined independently of a channel width ratio (i.e., resistance ratio) of the third NMOS transistor T3 to the fourth NMOS transistor T4 because the third clock signal C3 has a low logic level voltage in a high logic level voltage region of the (i−1)th row line input signal $g_{i-1}$. Also, since a voltage at the second node P2 remains at a low logic level during a time interval from when the fourth NMOS transistor T4 is turned on until a time interval before the third transistor T3 is turned on, the second and sixth NMOS transistors T2 and T6 are turned off.

If the first clock signal C1 changes from a low logic level voltage into a high logic level voltage, then the output line $14_i$ is charged into a high logic level voltage with the aid of a high logic level of first clock signal C1 applied via the drain and the source of the fifth NMOS transistor T5. The capacitor CAP1 raises a voltage at the first node P1 by a voltage level of the first clock signal C1 when a high logic level of first clock signal C1 is applied to the output line $14_i$.

Figure 11:
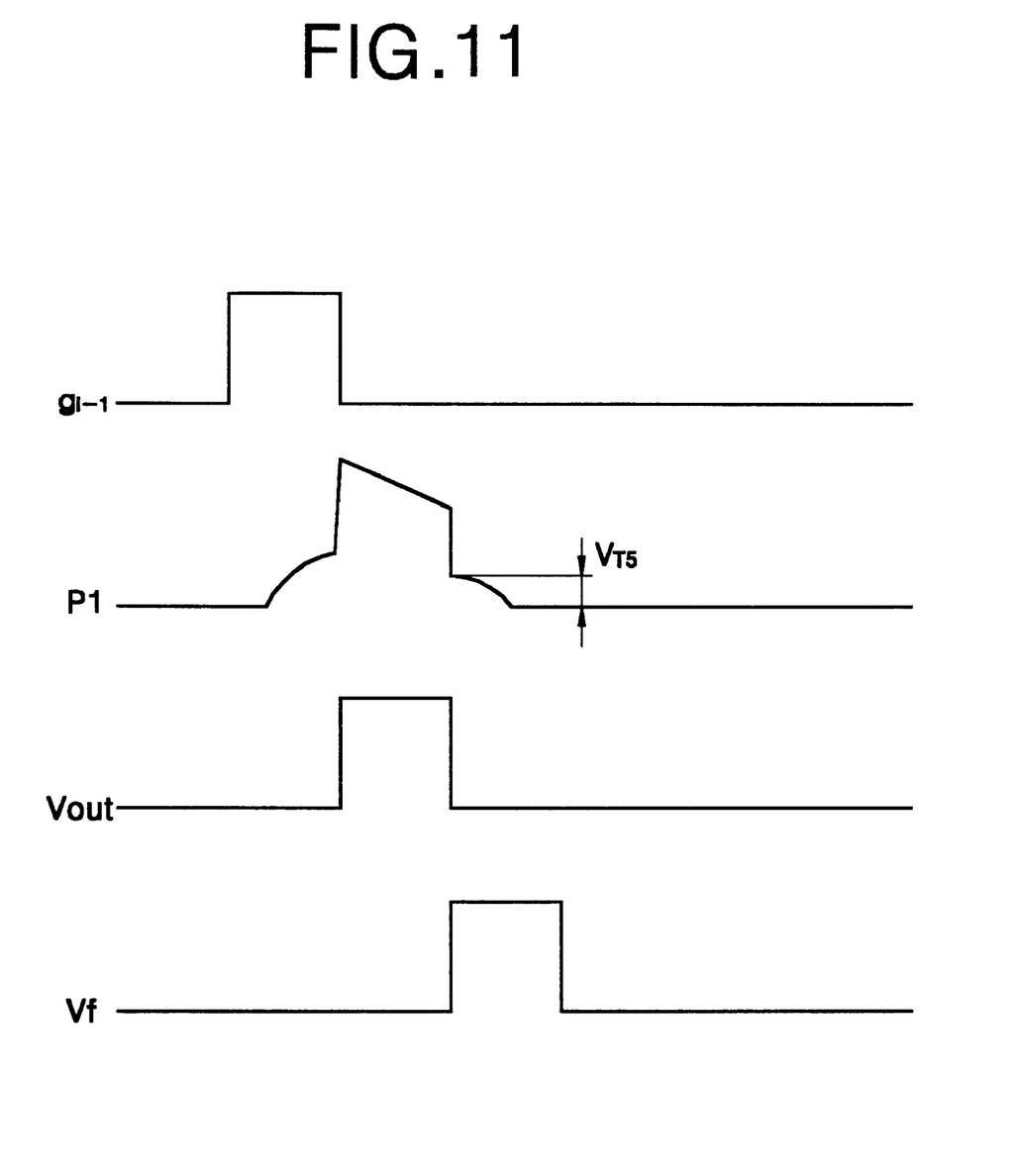
FIG. 11 is voltage waveform diagrams showing that a falling time of the output voltage becomes long.

Further, if the first clock signal C1 transits from a high logic level voltage into a low logic level voltage, the output signal Vout at the output line $14_i$ changes into a low logic level. This results from the fifth NMOS transistor T5 being in a turned-on state. In addition, the-seventh NMOS transistor T5 is turned on with the aid of a high logic level voltage, of feedback signal Vf from the next stage $12_{i+1}$, thereby discharging the output signal Vout at the output line $14_i$, via the ground voltage line VSSL, into the ground voltage source VSS rapidly. Accordingly, a long falling time of the output signal Vout is shortened as shown in FIG. 11. The increased falling time of the output signal Vout is caused by a fact that the channel width of the fifth NMOS transistor T5 becomes narrow slowly as a voltage at the first node P1 decreases slowly. In other words, since a discharge path provided by the fifth NMOS transistor T5 becomes narrow slowly, a falling time of the output signal Vout is lengthened. A new discharge path from the seventh NMOS transistor T7 is provided in addition to the discharge path from the fifth NMOS transistor T5, so that the output voltage Vout at the output line $14_i$ is rapidly discharged. As a result, a falling time of the output signal Vout is shortened.

As described above, the shift register according to the present invention drives stages sequentially by utilizing four clock signals, and allows each stage to be configured irrespective of the size of transistors. Accordingly, in the shift register according to the present invention, a change in a circuit characteristic caused by a variation in a device drift and a threshold voltage, etc. can be minimized. As a result, current flows only during a transition interval of signal, so that the power consumption is reduced, and also a deterioration in a device characteristic caused by overcurrent is restrained. Furthermore, in the shift register according to the present invention, a separate capacitor is provided between the output node and the bootstrap node and a capacitor is provided between the direct current source and the bootstrap node, so that a voltage variation at the bootstrap node can be restrained As a result, the shift register according to the present invention operates more stably.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A shift register having a plurality of stages which are connected to a high level voltage source, a low level voltage source and a phase-delayed clock signal generator, wherein the stages are connected to corresponding row lines and are connected in cascade with respect to a scanning signal for charging and discharging the row lines, each one of the stages comprising:

output circuit device including a pull-up transistor and a pull-down transistor, said pull-up transistor having:
  a first input electrode responsive to a first clock signal having a delayed phase in comparison to the scanning signal,
  a first output electrode connected to the row line, and
  a first control electrode;
said pull-down transistor having:
  a second input electrode connected to the low level voltage source,
  a second output electrode connected to the row line, and
  a second control electrode;
input circuit device responsive to the scanning signal for generating a first control signal to be applied to the first control electrode, and responsive to a second clock signal having a delayed phase in comparison to the scanning signal for generating a second control signal to be applied to the second control electrode; and
means for raising a voltage of the first control signal responsive to a signal on the row line, said means being external to said pull-up transistor of said output circuit device.

2. The shift register of claim 1, wherein the input circuit device comprises:
a first transistor having a third input electrode responsive to the scanning signal, a third output electrode connected to the first control electrode, and a third control electrode connected to the third input electrode; and
a second transistor having a fourth input electrode connected to the low level voltage source, a fourth output electrode connected to the first control electrode, and a fourth control electrode connected to the second control electrode.

3. The shift register of claim 2, wherein the input circuit device further comprises:
a third transistor having a fifth input electrode connected to the high level voltage source, a fifth output electrode connected to the second control electrode, and a fifth control electrode responsive to the second clock signal; and
a fourth transistor having a sixth input electrode connected to the low level voltage source, a sixth output electrode connected to the second control electrode, and a sixth control electrode responsive to the scanning signal.

4. The shift register of claim 1, where in the voltage raising means includes a first capacitor connected to the row line and the first control electrode.

5. The shift register of claim 1, further comprising:
a second capacitor connected between the first control electrode and the low level voltage source; and
a third capacitor connected between the second control electrode and the low level voltage source.

6. A shift register having a plurality of stages which are connected to a high level voltage source, a low level voltage source and a phase-delayed clock signal generator, wherein the stages are connected to corresponding row lines and are connected in cascade with respect to a scanning signal for charging and discharging the row lines, each one of the stages comprising:

output circuit means including a pull-up transistor and a pull-down transistor, said pull-up transistor having
  a first input electrode responsive to a first clock signal having a delayed phase in comparison to the scanning signal,
  a first output electrode connected to the row line, and
  a first control electrode;
said pull-down transistor having
  a second input electrode connected to the low level voltage source,
  a second output electrode connected to the row line, and
  a second control electrode;
input circuit means being responsive to the scanning signal for generating a first control signal to be applied to the first control electrode, and responsive to a second clock signal having a delayed phase in comparison to the first clock signal for generating a second control signal to be applied to the second control electrode;
means external to said pull-up transistor for raising a voltage for the first control signal; and
means for discharging the second control signal during a time interval when the first control signal is enabled.

7. The shift register of claim 6, wherein the input circuit means comprises:
a first transistor having a third input electrode responsive to the scanning signal, a third output electrode connected to the first control electrode, and a third control electrode connected to the third input electrode; and
a second transistor having a fourth input electrode connected to the low level voltage source, a fourth output electrode connected to the first control electrode, and a fourth control electrode connected to the second control electrode.

8. The shift register of claim 7, wherein the input circuit means further comprises:
a third transistor having a fifth input electrode connected to the high level voltage source, a fifth output electrode connected to the second control electrode, and a fifth control electrode responsive to the second clock signal.

9. The shift register of claim 6, wherein the voltage raising means includes a capacitor connected to the row line and the first control electrode.

10. The shift register of claim 6, wherein the discharging means includes a fourth transistor having a sixth input electrode connected to the low level voltage source, a sixth output electrode connected to the second control electrode, and a sixth control electrode connected to the first control electrode.

11. A shift register having a plurality of stages which are connected to a high level voltage source, a low level voltage source and a phase-delayed clock signal generator, wherein the stages are connected to corresponding row lines and are connected in cascade with respect to a scanning signal for charging and discharging the row lines, each one of the stages comprising:

output circuit device including a pull-up transistor and a pull-down transistor, said pull-up transistor having a first input electrode for receiving a first clock signal having a delayed phase in comparison to the scanning signal, a first output electrode connected to the raw line, and a first control electrode; said pull-down transistor having a second input electrode connected to the low level voltage source, a second output electrode connected to the row line, and a second control electrode;

input circuit device being responsive to the scanning signal for generating a first control signal to be applied to the first control electrode, and responsive to a second clock signal having a delayed phase in comparison to the scanning signal for generating a second control signal to be applied to the second control electrode;

means for raising a voltage of the first control signal; and means for accelerating a discharging speed at the row line.

12. The shift register of claim 11, wherein the input circuit device comprises:

a first transistor having a third input electrode responsive to the scanning signal, a third output electrode connected to the first control electrode, and a third control electrode connected to the third input electrode; and a second transistor having a fourth input electrode connected to the low level voltage source, a fourth output electrode connected to the first control electrode, and a fourth control electrode connected to the second control electrode.

13. The shift register of claim 12, wherein the input circuit device further comprises:

a third transistor having a fifth input electrode connected to the high level voltage source, a fifth output electrode connected to the second control electrode, and a fifth control electrode responsive to the second clock signal; and a fourth transistor having a sixth input electrode connected to the low level voltage source, a sixth output electrode connected to the second control electrode, and a sixth control electrode responsive to the scanning signal.

14. The shift register of claim 11, wherein the voltage raising means includes a capacitor connected to the row line and the first control electrode.

15. The shift register of claim 11, wherein the accelerating means includes a fifth transistor having a seventh input electrode connected to the low level voltage source, an output electrode connected to the row line, and a seventh control electrode for responding to a signal from the output line of the next stage.

16. A shift register for driving gate lines of liquid crystal display and responsive to a scanning signal, a first voltage source and a second voltage source, the shift register comprising:

a plurality of stages, each stage including output circuit device including a pull-up transistor and a pull-down transistor, the pull-up transistor having a first control electrode, a first input electrode coupled to a first clock signal having a delayed phase in comparison to the scanning signal and a first output electrode connected to a gate line; said pull-down transistor having a second control electrode, a second input electrode coupled to the second voltage source and a second output electrode connected to the gate line;

input circuit device responsive to the scanning signal for generating a first control signal to be applied to the first control electrode, and responsive to a second clock signal having a delayed phase in comparison to the scanning signal for generating a second control signal to be applied to the second control electrode; and a voltage controller coupled between the first control electrode and the gate line to raise a voltage of the first control signal.

17. The shift register of claim 16 wherein the input circuit device comprises:

a first transistor having a third input electrode responsive to the scanning signal, a third output electrode connected to the first control electrode, and a third control electrode connected to the third input electrode; and a second transistor having a fourth input electrode connected to the second voltage source, a fourth output electrode connected to the first control electrode, and a fourth control electrode connected to the second control electrode.

18. The shift register of claim 17, wherein the input circuit device further comprises:

a third transistor having a fifth input electrode connected to the first voltage source, a fifth output electrode connected to the second control electrode, and a fifth control electrode responsive to the second clock signal; and a fourth transistor having a sixth input electrode connected to the second voltage source, a sixth output electrode connected to the second control electrode, and a sixth control electrode responsive to the scanning signal.

19. The shift register of claim 16, wherein the voltage controller includes a first capacitor.

20. The shift register of claim 16, further comprising:

a second capacitor connected between the first control electrode and the second voltage source; and a third capacitor connected between the second control electrode and the second voltage source.

21. A shift register for driving gate lines of liquid crystal display and responsive to a scanning signal, a first voltage source and a second voltage source, the shift register comprising:

a plurality of stages, each stage including output circuit device including a pull-up transistor and a pull-down transistor, the pull-up transistor having a first control electrode, a first input electrode coupled to a first clock signal having a delayed phase in comparison to the scanning signal and a first output electrode connected to a gate line; said pull-down transistor having a second control electrode, a second input electrode coupled to the second voltage source and a second output electrode connected to the gate line;

input circuit device responsive to the scanning signal for generating a first control signal to be applied to the first control electrode, and responsive to a second clock signal having a delayed phase in comparison to the first clock signal for generating a second control signal to be applied to the second control electrode;

a voltage controller coupled between the first control electrode and the gate line to raise a voltage of the first control signal; and a discharging device responsive to the first control signal to discharge the second control signal.

22. The shift register of claim 21, wherein the input circuit device comprises:

a first transistor having a third input electrode responsive to the scanning signal, a third output electrode connected to the first control electrode, and a third control electrode connected to the third input electrode; and a second transistor having a fourth input electrode connected to the second voltage source, a fourth output electrode connected to the first control electrode, and a fourth control electrode connected to the second control electrode.

23. The shift register of claim 22, wherein the input circuit device further comprises:

a third transistor having a fifth input electrode connected to the first voltage source, a fifth output electrode connected to the second control electrode, and a fifth control electrode responsive to the second clock signal.

24. The shift register of claim 21, wherein the voltage controller includes a capacitor.

25. The shift register of claim 21, wherein the discharging device includes a fourth transistor having a sixth input electrode connected to the second voltage source, a sixth output electrode connected to the second control electrode, and a sixth control electrode connected to the first control electrode.

26. A shift register for a driving gate lines of liquid crystal display and responsive to a scanning signal, a first voltage source and a second voltage source, the shift register comprising:

a plurality of stages, each stage including
output circuit device including a pull-up transistor and a pull-down transistor, the pull-up transistor having a first control electrode, a first input electrode coupled to a first clock signal having a delayed phase in comparison to the scanning signal and a first output electrode connected to a gate line; said pull-down transistor having a second control electrode, a second input electrode coupled to the second voltage source and a second output electrode connected to the gate line;

input circuit device responsive to the scanning signal for generating a first control signal to be applied to the first control electrode, and responsive to a second clock signal having a delayed phase in comparison to the scanning signal for generating a second control signal to be applied to the second control electrode;

a voltage controller coupled between the first control electrode and the gate line to raise a voltage of the first control signal;

a first discharging device responsive to the scanning signal to discharge the second control signal; and a second discharging device coupled to the gate line.

27. The shift register of claim 26, wherein the input circuit device comprises:

a first transistor having a third input electrode responsive to the scanning signal, a third output electrode connected to the first control electrode, and a third control electrode connected to the third input electrode; and a second transistor having a fourth input electrode connected to the second voltage source, a fourth output electrode connected to the first control electrode, and a fourth control electrode connected to the second control electrode.

28. The shift register of claim 27, wherein the input circuit device further comprises:

a third transistor having a fifth input electrode connected to the first voltage source, a fifth output electrode connected to the second control electrode, and a fifth control electrode for receiving the second clock signal; and a fourth transistor having a sixth input electrode connected to the second voltage source, a sixth output electrode connected to the second control electrode, and a sixth control electrode for responding to the scanning signal.

29. The shift register of claim 26, wherein the voltage controller includes a capacitor.

30. The shift register of claim 26, wherein the second discharging device includes a fifth transistor having a seventh input electrode connected to the second voltage source, an output electrode connected to the gate line, and a seventh control electrode responsive to a signal from an output line of the next stage of the shift register.

* * * * *